(12) United States Patent
Li et al.

(10) Patent No.: US 10,431,569 B2
(45) Date of Patent: Oct. 1, 2019

(54) METHOD OF TRANSFERRING MICRO DEVICES

(71) Applicant: PlayNitride Inc., Tainan (TW)

(72) Inventors: Yun-Li Li, Tainan (TW); Tzu-Yang Lin, Tainan (TW); Yu-Hung Lai, Tainan (TW); Pei-Hsin Chen, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

(21) Appl. No.: 15/612,839

(22) Filed: Jun. 2, 2017

(65) Prior Publication Data
US 2018/0294387 A1    Oct. 11, 2018

(30) Foreign Application Priority Data
Apr. 10, 2017   (TW) .............................. 106111839 A (51) Int. Cl.
| | | |
|---|---|---|
| *H01L 33/48* | (2010.01) | |
| *H01L 25/075* | (2006.01) | |
| *H01L 23/00* | (2006.01) | |

(52) U.S. Cl.
CPC .......... *H01L 25/0753* (2013.01); *H01L 24/27* (2013.01); *H01L 24/29* (2013.01); *H01L 24/30* (2013.01); *H01L 24/32* (2013.01); *H01L 24/83* (2013.01); *H01L 2224/27002* (2013.01); *H01L 2224/27003* (2013.01); *H01L 2224/291* (2013.01); *H01L 2224/29006* (2013.01); *H01L 2224/2908* (2013.01); *H01L 2224/2919* (2013.01); *H01L 2224/29109* (2013.01); *H01L 2224/29111* (2013.01); *H01L 2224/29116* (2013.01); *H01L 2224/29118* (2013.01);
(Continued)

(58) Field of Classification Search
None
See application file for complete search history.

(56) References Cited

U.S. PATENT DOCUMENTS

| | | | |
|---|---|---|---|
| 2013/0210194 A1* | 8/2013 | Bibl | ........................ H01L 24/83 |
| | | | 438/107 |
| 2016/0144608 A1* | 5/2016 | Chang | ..................... B32B 37/12 |
| | | | 216/83 |

(Continued)

FOREIGN PATENT DOCUMENTS

TW         201023243          6/2010

OTHER PUBLICATIONS

"Office Action of Taiwan Counterpart Application," dated Mar. 7, 2019, p. 1-p. 6.

*Primary Examiner* — Asok K Sarkar
(74) *Attorney, Agent, or Firm* — J.C. Patents (57) ABSTRACT

A method of transferring micro devices is provided. A carrier substrate including a buffer layer and a plurality of micro devices is provided. The buffer layer is located between the carrier substrate and the micro devices. The micro devices are separated from one another and positioned on the carrier substrate through the buffer layer. A receiving substrate contacts the micro devices disposed on the carrier substrate. A temperature of at least one of the carrier substrate and the receiving substrate is changed, so that at least a portion of the micro devices are released from the carrier substrate and transferred onto the receiving substrate. A number of the at least a portion of the micro devices is between 1000 and 2000000.

30 Claims, 8 Drawing Sheets

(52) U.S. Cl.
CPC .............. *H01L 2224/30181* (2013.01); *H01L 2224/30505* (2013.01); *H01L 2224/32013* (2013.01); *H01L 2224/32145* (2013.01); *H01L 2224/32225* (2013.01); *H01L 2224/83005* (2013.01); *H01L 2224/83097* (2013.01); *H01L 2224/83191* (2013.01); *H01L 2224/83192* (2013.01); *H01L 2924/12041* (2013.01); *H01L 2924/37001* (2013.01)

(56) References Cited

U.S. PATENT DOCUMENTS

| | | | |
|---|---|---|---|
| 2017/0170049 A1* | 6/2017 | Hu | .................. H01L 21/6835 |
| 2017/0215280 A1 | 7/2017 | Chaji | |
| 2018/0033909 A1* | 2/2018 | Schubert | ................ H01L 33/62 |
| 2018/0151804 A1 | 5/2018 | Chaji | |

\* cited by examiner

METHOD OF TRANSFERRING MICRO DEVICES

CROSS-REFERENCE TO RELATED APPLICATION

This application claims the priority benefit of Taiwan application serial no. 106111839, filed on Apr. 10, 2017. The entirety of the above-mentioned patent application is hereby incorporated by reference herein and made a part of this specification.

BACKGROUND OF THE INVENTION

Field of the Invention

The invention relates to a method of transferring micro devices, particularly to a method capable of bulk transferring micro devices.

Description of Related Art

In present days, light emitting diodes (LEDs) on a carrier substrate can be transferred onto a receiving substrate through a force at a distance such as electrostatic force or magnetic force. The number of the LEDs that can be transferred through the abovementioned method, however, is limited by the size of an electrostatic head or a magnetic head. The transferring efficiency thus cannot be effectively increased and the need for bulk transfer cannot be satisfied. Moreover, in the abovementioned method, the LEDs on the carrier substrate must be first picked up by static electricity or magnetic force through contact with the electrostatic head or the magnetic head and then transferred and positioned on the receiving substrate; afterwards, the LEDs are released onto the receiving substrate by removing the force at a distance such as electrostatic force or magnetic force. The aforementioned steps of transferring the LEDs are so complicated that it is difficult to improve efficiency in transferring the LEDs.

SUMMARY OF THE INVENTION

The invention provides a method of transferring micro devices, which achieves bulk transfer of micro devices and has an advantage of high transferring efficiency.

The method of transferring micro devices includes steps as follows. A carrier substrate is provided on which a buffer layer and a plurality of micro devices are disposed. The buffer layer is located between the carrier substrate and the micro devices. The micro devices are separated from one another and are positioned on the carrier substrate through the buffer layer. A receiving substrate is made to contact the micro devices on the carrier substrate. A temperature of at least one of the carrier substrate and the receiving substrate is changed, so that at least a portion of the micro devices are released from the carrier substrate and transferred onto the receiving substrate. A number of the at least a portion of the micro devices is in a range from 1000 to 2000000.

In an embodiment of the invention, the buffer layer covers a lower surface of the carrier substrate and the micro devices expose a portion of the buffer layer.

In an embodiment of the invention, the buffer layer includes a plurality of buffer parts corresponding to the micro devices. The buffer parts are separated from one another and expose a portion of the carrier substrate.

In an embodiment of the invention, the step of making the receiving substrate contact the micro devices on the carrier substrate includes: a bonding layer is provided between the micro devices and the receiving substrate, wherein the micro devices contact the receiving substrate through the bonding layer.

In an embodiment of the invention, the bonding layer is formed on the micro devices or on the receiving substrate so as to entirely cover a plurality of lower surfaces of the micro devices or an upper surface of the receiving substrate.

In an embodiment of the invention, the bonding layer includes a plurality of bonding parts corresponding to the micro devices.

In an embodiment of the invention, the bonding parts are formed on the micro devices, on the receiving substrate, or on both the micro devices and the receiving substrate.

In an embodiment of the invention, the step of changing the temperature of at least one of the carrier substrate and the receiving substrate includes: the temperature of the carrier substrate is raised to reduce bonding force between the at least a portion of the micro devices and the carrier substrate, such that the micro devices are transferred to the receiving substrate.

In an embodiment of the invention, the temperature of the carrier substrate is raised to a range from 50 degree Celsius to 200 degree Celsius.

In an embodiment of the invention, the temperature of the carrier substrate differs from the temperature of the receiving substrate after the temperature of at least one of the carrier substrate and the receiving substrate is changed.

In an embodiment of the invention, a material of the bonding layer is identical to a material of the buffer layer. A melting point temperature of the bonding layer is Tmr, the temperature of the carrier substrate is Tc, and the temperature of the receiving substrate is Tr. Tr<Tmr<Tc.

In an embodiment of the invention, the material of the bonding layer differs from the material of the buffer layer. The melting point temperature of the bonding layer is Tmr, a melting point temperature of the buffer layer is Tmc, the temperature of the carrier substrate is Tc, and the temperature of the receiving substrate is Tr. Tc>Tmc and Tr<Tmr.

In an embodiment of the invention, a maximum width of each of the micro devices is in a range from 3 µm to 100 µm.

In an embodiment of the invention, each of the micro devices is an inorganic light emitting diode.

In an embodiment of the invention, the carrier substrate is composed of an inorganic material, while the buffer layer is composed of an organic material. Hardness of the carrier substrate is greater than hardness of the buffer layer.

In an embodiment of the invention, a Young's modulus of the buffer layer is smaller than 10 GPa, while a Young's modulus of the carrier substrate is greater than 20 GPa.

In an embodiment of the invention, hardness of the micro devices is greater than the hardness of the buffer layer.

In an embodiment of the invention, the Young's modulus of the buffer layer is smaller than 10 GPa, while Young's moduli of the micro devices are greater than 20 GPa.

In an embodiment of the invention, surface roughness of the carrier substrate is smaller than 2.5 µm.

Based on the above, the method of transferring micro devices in the invention is as follows. The receiving substrate is made to contact the micro devices on the carrier substrate. Then, by changing the temperature of at least one of the carrier substrate and the receiving substrate, the micro devices in a number ranging from 1000 to 2000000 are simultaneously released from the carrier substrate and transferred onto the receiving substrate. Compared with the conventional method of transferring LEDs through a force at a distance such as electrostatic force or magnetic force, the method of transferring micro devices in the invention achieves bulk transfer of micro devices and has an advantage of high transferring efficiency.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1A:
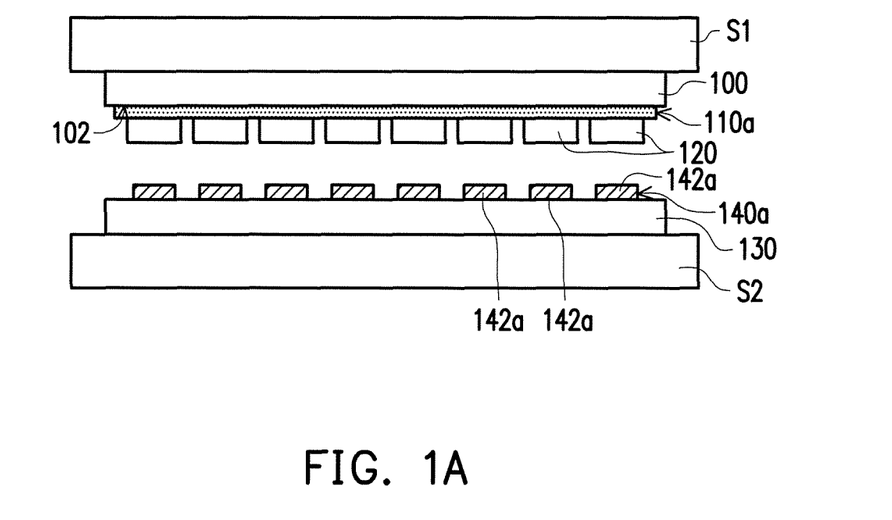
FIG. 1A to FIG. 1C are schematic cross-sectional views of a method of transferring micro devices in an embodiment of the invention.
Figure 1B:
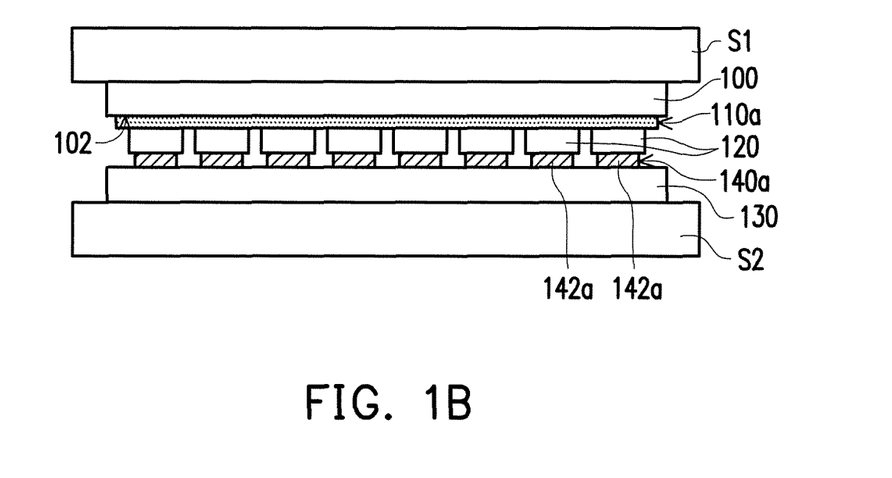
Figure 1C:
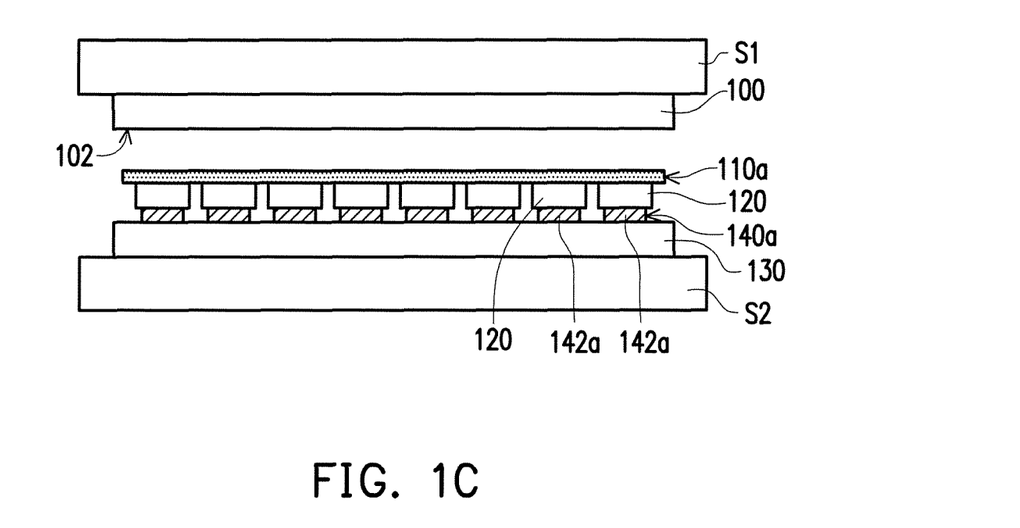

FIG. 1A to FIG. 1C are schematic cross-sectional views of a method of transferring micro devices in an embodiment of the invention. Please first refer to FIG. 1A. According to the method of transferring micro devices of the present embodiment, a carrier substrate 100 is provided first. A buffer layer 110a and a plurality of micro devices 120 are disposed on the carrier substrate 100, wherein the buffer layer 110a is located between the carrier substrate 100 and the micro devices 120, and the micro devices 120 are separated from one another and are positioned on the carrier substrate 100 through the buffer layer 110a.

More specifically, surface roughness of the carrier substrate 100 of the present embodiment is, for example, smaller than 2.5 μm and preferably in a range from 0.01 μm to 2 μm. A material of the carrier substrate 100 is an inorganic material such as a sapphire substrate or a glass substrate. Nevertheless, the invention is not limited to the above. The surface roughness of the carrier substrate 100 is controlled to be smaller than 2.5 μm so that the micro devices 120 have uniform horizontal heights and stability of a manufacturing process of the micro devices 120 is improved. As shown in FIG. 1A, the buffer layer 110a entirely covers a lower surface 102 of the carrier substrate 100. The buffer layer 110a may be taken as a buffer structure. A material of the buffer layer 110a is an organic material such as a macromolecular polymer having viscosity and formed by thermal curing or UV curing, and examples thereof include epoxy resin, polyimide, polyester, polyurethane, benzocyclobutene, polyethylene, polypropylene, polyacrylate, and a combination thereof. That is to say, the buffer layer 110a may possess both adhering and buffering functions. Furthermore, the buffer layer 110a may be a single-layered structure or a multi-layered structure. For example, the buffer layer 110a may be a double-layered structure of two types of macromolecular materials or a multi-layered structure obtained by alternately stacking two types of macromolecules. Nevertheless, the invention is not limited to the above. Additionally, the material of the buffer layer 110a of the present embodiment may also be a metal or a an alloy with a melting point of lower than 200 degree Celsius, and examples thereof include indium, an indium-bismuth alloy, a tin-bismuth alloy, a lead-tin alloy, a zinc-tin alloy, etc. Nevertheless, the invention is not limited to the above. Hardness of the carrier substrate 100 is greater than hardness of the buffer layer 110a, and hardness of the micro devices 120 is greater than the hardness of the buffer layer 110a. A Young's modulus of the buffer layer 110a is smaller than 10 GPa, a Young's modulus of the carrier substrate 100 is greater than 20 GPa, and Young's moduli of the micro devices 120 are greater than 20 GPa.

As shown in FIG. 1A, the micro devices 120 of the present embodiment are positioned on the carrier substrate 100 in an array arrangement through the buffer layer 110a. The micro devices 120 expose a portion of the buffer layer 110a. In other words, a portion of the buffer layer 110a is exposed between two adjacent micro devices 120. The micro devices 120 herein are, for example, inorganic LEDs such as lateral LEDs or vertical LEDs. Preferably, a maximum width of each of the micro devices 120 is in a range from 3 μm to 100 μm. That is to say, the micro devices 120 of the present embodiment are specifically micro LEDs.

Next, please again refer to FIG. 1A, a receiving substrate 130 is provided and is specifically a thin film transistor (TFT) substrate. In other embodiments, the receiving substrate 130 may be a glass substrate, a ceramic substrate, a semiconductor substrate, a submount, a complementary metal-oxide-semiconductor (CMOS) circuit substrate, a liquid-crystal-on-silicon (LCOS) substrate, or other substrates with a driving unit.

It should be explained that, in the present embodiment, the carrier substrate 100 may be disposed on a first supporting board S1 and the receiving substrate 130 may be disposed on a second supporting board S2 in order to enhance structural strength of the carrier substrate 100 and the receiving substrate 130. The first supporting board S may be a supporting board with or without a heating function. The second supporting board S2 may be a supporting board with or without a heating function.

Next, please refer to FIG. 1A and FIG. 1B together. The receiving substrate 130 is made to contact the micro devices 120 on the carrier substrate 100. In the present embodiment, the step of making the receiving substrate 130 contact the micro devices 120 on the carrier substrate 100 includes: a bonding layer 140a is provided between the micro devices 120 and the receiving substrate 130, wherein the micro devices 120 contact the receiving substrate 130 through the bonding layer 140a. Herein, the bonding layer 140a specifically includes a plurality of bonding parts 142a corresponding to the micro devices 120. The bonding parts 142a are formed on the receiving substrate 130. Nevertheless, the invention is not limited to the above. In other words, the micro devices 120 are interposed between the buffer layer 110a disposed on the carrier substrate 100 and the bonding layer 140a formed on the receiving substrate 130. Herein, a material of the bonding layer 140a may be identical to the material of the buffer layer 110a. By the carrier substrate 100 and the receiving substrate 130 having different temperatures from each other, the buffer layer 110a and the bonding layer 140a may be in different states. For example, when the buffer layer 110a is in a liquid state and the bonding layer 140a is in a solid state, i.e., the buffer layer 110a and the bonding layer 140a are present in different states, the micro devices 120 do not slide and are not displaced when being transferred. As a result, the micro devices 120 are released from the carrier substrate 100 and can accurately be transferred to corresponding positions on the receiving substrate 130. Additionally, the material of the bonding layer 140a may also differ from the material of the buffer layer 110a. The material of the bonding layer 140a is not limited, and may be a metal or a macromolecular polymer. A material capable of bonding the micro devices 120 with the receiving substrate 130 and a material suitably selected according to the melting point of the material of the buffer layer 110a may both be used as the material of the bonding layer 140a.

Since the hardness of the buffer layer 110a is smaller than the hardness of the carrier substrate 100 and the hardness of the micro devices 120, the carrier substrate 100 and the micro devices 120 with greater hardness are not damaged when the receiving substrate 130 contacts the micro devices 120 on the carrier substrate 100, and an yield rate of the micro devices 120 after transfer is therefore ensured. Moreover, the Young's modulus of the buffer layer 110a is smaller than the Young's modulus of the carrier substrate 100 and the Young's moduli of the micro devices 120. In other words, the buffer layer 110a has higher flexibility, such that a stress caused by a contact between the receiving substrate 130 and the micro devices 120 on the carrier substrate 100 may be absorbed by the buffer layer 110a. As a result, the micro devices 120 are transferred accurately to predetermined positions and the yield rate problem caused by displacement of the micro devices 120 is reduced. Preferably, the Young's modulus of the buffer layer 110a falls into a range from 0.01 GPa to 10 GPa and the Young's moduli of the micro devices 120 and the carrier substrate 100 fall into a range from 20 GPa to 300 GPa.

It should be explained that the bonding parts 142a of the bonding layer 140a as shown herein is an exemplary structure and should be designed in accordance with the structure of the micro devices 120. For example, when the micro devices 120 are specifically lateral LEDs, the bonding parts 142a should be formed into two parts separated from each other in accordance with two electrodes of the micro devices 120. When the micro devices 120 are specifically vertical LEDs, the bonding parts 142a should be formed in the state as shown in FIG. 1A to FIG. 1C in accordance with one electrode of the micro devices 120. Additionally, a number of the bonding parts 142a of the bonding layer 140a of the present embodiment is substantially identical to a number of the micro devices 120. Therefore, all of the micro devices 120 of the present embodiment may be transferred onto the bonding parts 142a of the bonding layer 140a formed on the receiving substrate 130. Particularly, in the present embodiment, the number of the micro devices 120 transferred onto the receiving substrate 130 is preferably in a range from 1000 to 2000000.

Finally, please refer to FIG. 1C. The temperature of at least one of the carrier substrate 100 and the receiving substrate 130 is changed, such that a least a portion of the micro devices 120 are released from the carrier substrate 100 and transferred onto the receiving substrate 130. More specifically, the step of changing the temperature of at least one of the carrier substrate 100 and the receiving substrate 130 includes: first, the temperature of the carrier substrate 100 is raised to reduce bonding force between the at least a portion of the micro devices 120 and the carrier substrate 100. Here, the temperature of the carrier substrate 100 may be raised by heating through the first supporting board S1, or by heating through the second supporting board S2 by means of a heat conduction mechanism. When the temperature of the carrier substrate 100 increases, the buffer layer 110a is present in a molten state due to its material characteristics. The bonding force between the micro devices 120 and the carrier substrate 100 is thereby reduced, such that the micro devices 120 are released from the substrate 100 and transferred onto the receiving substrate 130.

In addition to the steps mentioned above, a step of bonding the micro devices 120 with the receiving substrate 130 may be further included. The details are as follows: the temperature of the receiving substrate 130 is raised to liquefy the bonding layer 140a. Here, the temperature of the receiving substrate 130 may be raised by heating the receiving substrate 130 through the second supporting board S2. When the temperature of the receiving substrate 130 increases, the bonding layer 140a is liquefied due to its material characteristics. Finally, an annealing process should be performed on the receiving substrate 130 to turn the bonding layer 140a from the liquid state to the solid state, so as to enhance the bonding force between the micro devices 120 and the receiving substrate 130.

Additionally, a material having viscosity may instead be used as the bonding layer 140a. The viscosity of the material is sufficient so that an adhesive force between the micro devices 120 and the bonding layer 140a is greater than the bonding force between the micro devices 120 and the carrier substrate 100. Therefore, the micro devices 120 are bonded onto the receiving substrate 130 through the bonding layer 140a.

Further, after the temperature of at least one of the carrier substrate 100 and the receiving substrate 130 is changed, the temperature of the carrier substrate 100 differs from the temperature of the receiving substrate 130. Preferably, the temperature of the carrier substrate 100 is raised to a range from 50 degree Celsius to 200 degree Celsius, while the temperature of the receiving substrate 130 is raised to a range from 80 degree Celsius to 280 degree Celsius. More specifically, if the material of the bonding layer 140a is identical to the material of the buffer layer 110a, a melting point temperature of the buffer layer 110a is Tmr, the temperature of the carrier substrate 100 is Tc, and the temperature of the receiving substrate 130 is Tr, then Tr<Tmr<Tc. That is to say, when the bonding layer 140a and the buffer layer 110a adopt the same material, the melting point temperature Tmc of the buffer layer 110a should fall between the temperature Tr of the receiving substrate 130 and the temperature Tc of the carrier substrate 100. In this way, the micro devices 120 on the carrier substrate 100 can be transferred onto the receiving substrate 130 due to a temperature difference between the carrier substrate 100 and the receiving substrate 130.

On the other hand, if the material of the bonding layer 140a differs from the material of the buffer layer 110a, the melting point temperature of the bonding layer 140a is Tmr, a melting point temperature of the buffer layer 110a is Tmc, the temperature of the carrier substrate 100 is Tc, and the temperature of the receiving substrate 130 is Tr, then Tc>Tmc and Tr<Tmr. That is to say, when the bonding layer 140a and the buffer layer 110a adopt different materials, the temperature Tc of the carrier substrate 100 should be higher than the melting point temperature Tmc of the buffer layer 110a, so as to effectively cause the buffer layer 110a to be present in the molten state due to its material characteristics. The bonding force between the micro devices 120 and the carrier substrate 100 is thereby reduced. The temperature Tr of the receiving substrate 130 should be lower than the melting point temperature Tmr of the bonding layer 140a, such that the micro devices 120 are transferred to the receiving substrate 130.

Briefly, the method of transferring micro devices of the present embodiment is as follows. First, the receiving substrate 130 is made to contact the micro devices 120 on the carrier substrate 100 that are in a number ranging from 1000 to 2000000. Then, the micro devices 120 are released from the carrier substrate 100 and transferred onto the receiving substrate 130 due to the temperature difference between the carrier substrate 100 and the receiving substrate 130, thereby completing a transfer of the micro devices. Compared with the conventional transferring process of LEDs performed through the force at a distance such as electrostatic force or magnetic force, the method of transferring micro devices of the present embodiment is capable of transferring 1000 to 2000000 micro devices at once, thereby achieving bulk transfer of the micro devices 120, and also has an advantage of high transferring efficiency.

It should be explained here that the following embodiments continue to use the reference numerals and partial contents of the previous embodiment, wherein the same reference numerals are used to indicate the same or similar elements, and descriptions of the same technical contents are omitted. Please refer to the above embodiment for the omitted part of description, which will not be repeated in the following embodiments.

Figure 2A:
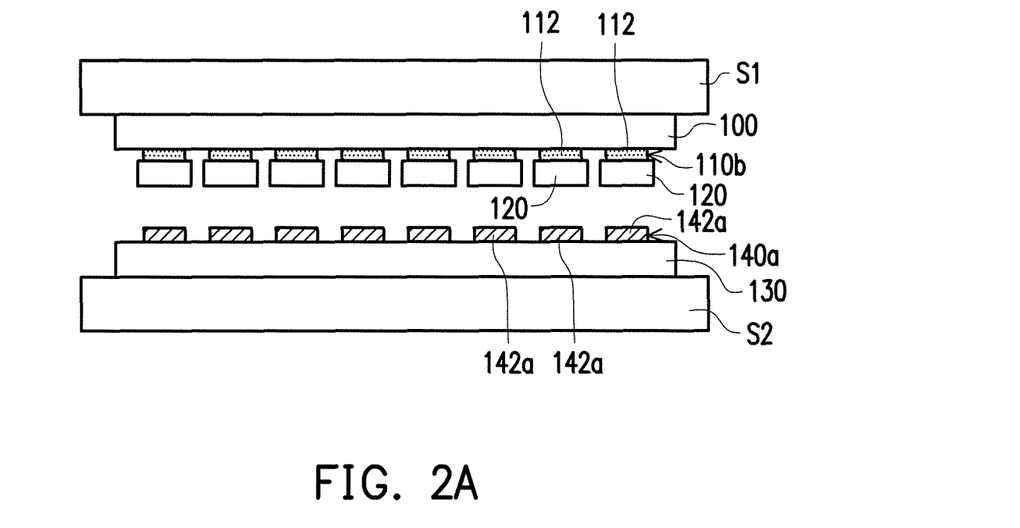
FIG. 2A to FIG. 2C are schematic cross-sectional views of a method of transferring micro devices in another embodiment of the invention.
Figure 2B:
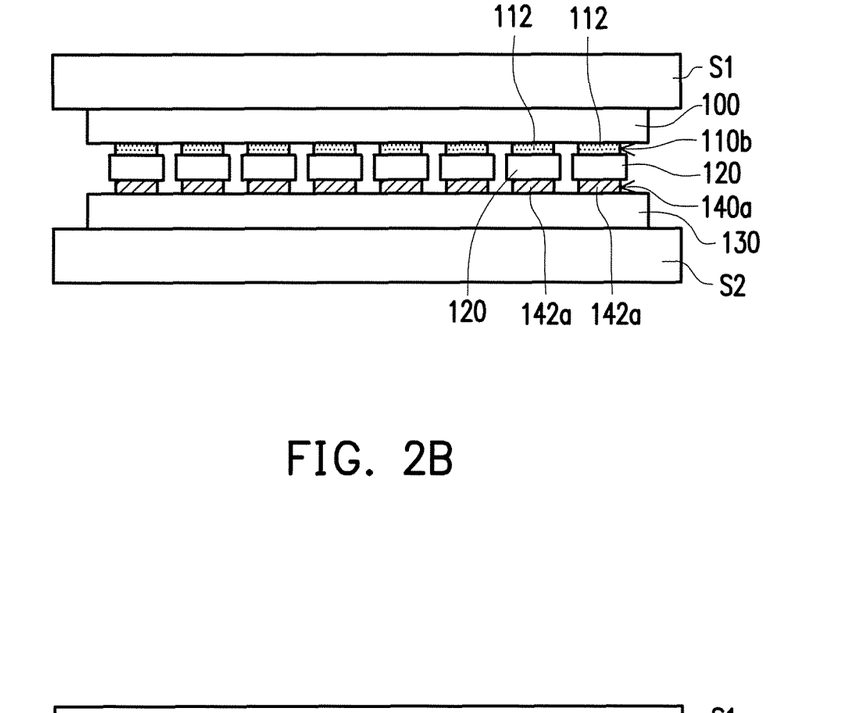
Figure 2C:
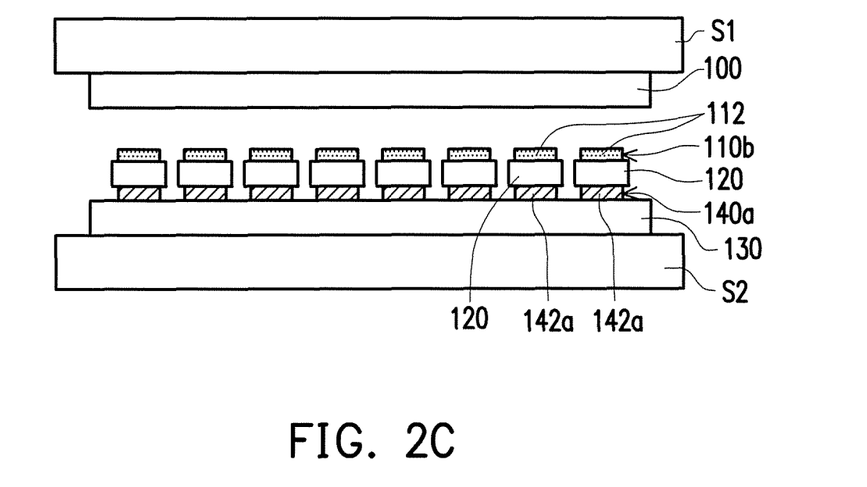

FIG. 2A to FIG. 2C are schematic cross-sectional views of a method of transferring micro devices in another embodiment of the invention. Please refer to FIG. 2A and FIG. 1A together. The transfer of micro devices of the present embodiment is similar to the transfer of micro devices in FIG. 1A. A difference between them lies in: in the step of providing the carrier substrate 100, a buffer layer 110b of the present embodiment includes a plurality of buffer parts 112 corresponding to the micro devices 120. The buffer parts 112 are separated from one another and expose a portion of the carrier substrate 100. Herein, a number of the buffer parts 112 is substantially identical to the number of the micro devices 120, and the number of bonding parts 142a of the bonding layer 140a is identical to the number of the micro devices 120. Particularly, areas of orthographic projections of the buffer parts 112 on the carrier substrate 100 completely overlap and are smaller than areas of orthographic projections of the corresponding micro devices 120 on the carrier substrate 100, so that the buffer parts 112 may provide a better buffering effect when the micro devices 120 are being transferred.

Next, please refer to FIG. 2B. Similarly to the step in FIG. 1, the receiving substrate 130 is made to contact the micro devices 120 on the carrier substrate 100. Herein, the micro devices 120 on the carrier substrate 100 respectively contact the bonding parts 142a of the bonding layer 140a on the receiving substrate 130. Then, please refer to FIG. 2C. Similarly to the step in FIG. 1C, the temperatures of the carrier substrate 100 and the receiving substrate 130 are changed. Due to the temperature difference between the carrier substrate 100 and the receiving substrate 130, the micro devices 120 are all released from the carrier substrate 100 onto the receiving substrate 130.

Figure 3A:
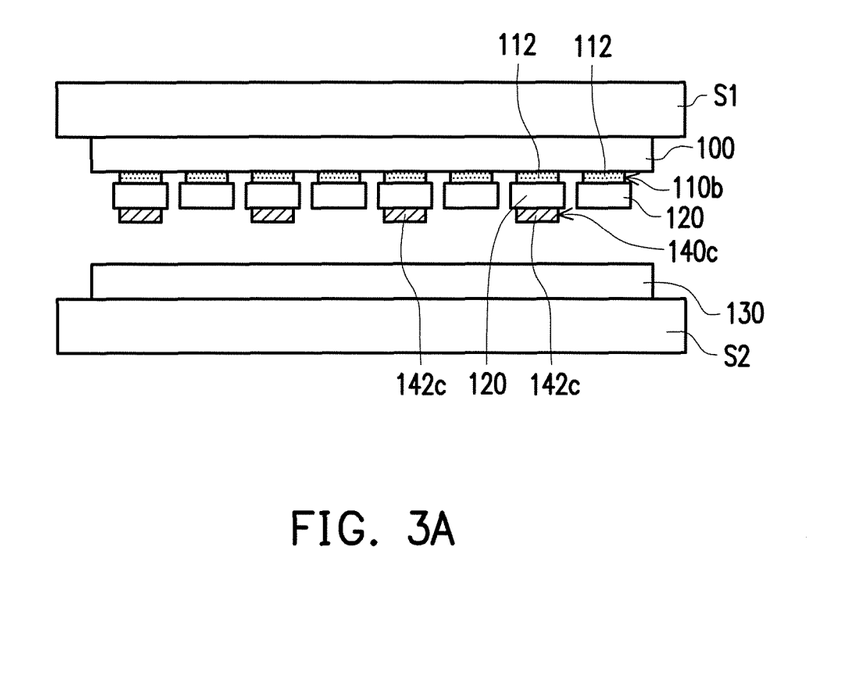
FIG. 3A to FIG. 3C are schematic cross-sectional views of a method of transferring micro devices in another embodiment of the invention.
Figure 3B:
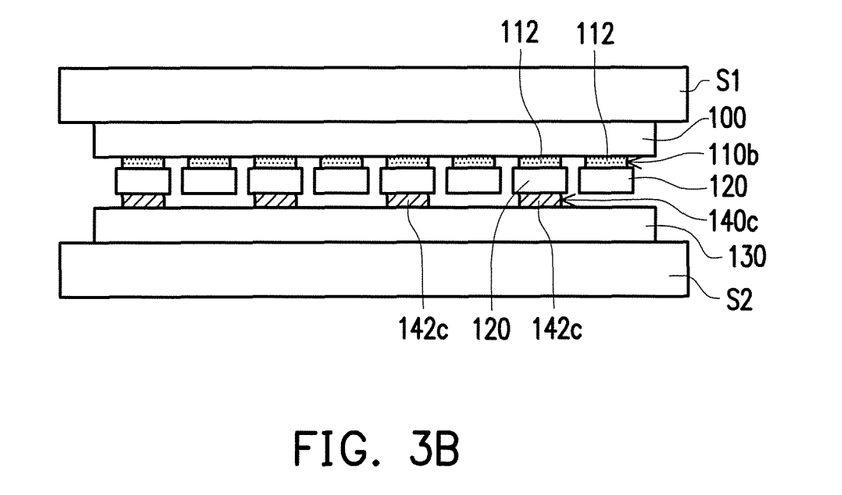
Figure 3C:
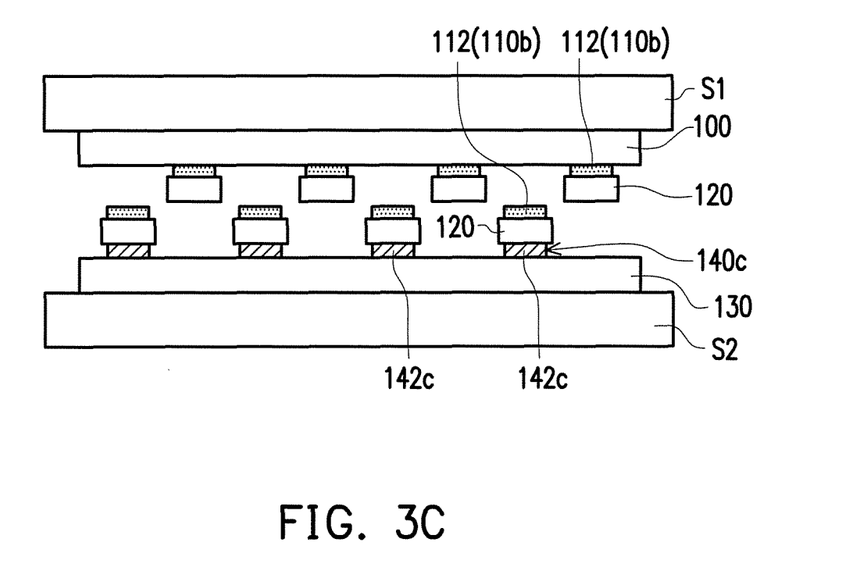

FIG. 3A to FIG. 3C are schematic cross-sectional views of a method of transferring micro devices in another embodiment of the invention. Please refer to FIG. 3A, FIG. 3B, FIG. 2A, and FIG. 2B altogether. The transfer of micro devices of the present embodiment is similar to the transfer of micro devices in FIG. 2A and FIG. 2B. A difference between them lies in: in the step in which the receiving substrate 130 contacts the micro devices 120 on the carrier substrate 100, bonding parts 142c of a bonding layer 140c of the present embodiment are formed on a portion of the micro devices 120. That is to say, the bonding parts 142c of the bonding layer 140c are selectively formed on the micro devices 120. Therefore, when the receiving substrate 130 contacts the micro devices 120 on the carrier substrate 100, only a portion of the micro devices 120 are bonded onto the receiving substrate 130 through the bonding parts 142c of the bonding layer 140c.

Then, please refer to FIG. 3C. Similarly to the step in FIG. 2C, the temperatures of the carrier substrate 100 and the receiving substrate 130 are changed. Due to the temperature difference between the carrier substrate 100 and the receiving substrate 130, a portion of the micro devices 120 are released from the carrier substrate 100 onto the receiving substrate 130. As shown in FIG. 3C, at this moment, a portion of the micro devices 120 remain positioned on the carrier substrate 100 and are not yet transferred onto the receiving substrate 130. In other words, the method of transferring micro devices of the present embodiment may partly or selectively transfer the micro devices 120 on the carrier substrate 100 onto the receiving substrate 130.

Figure 4A:
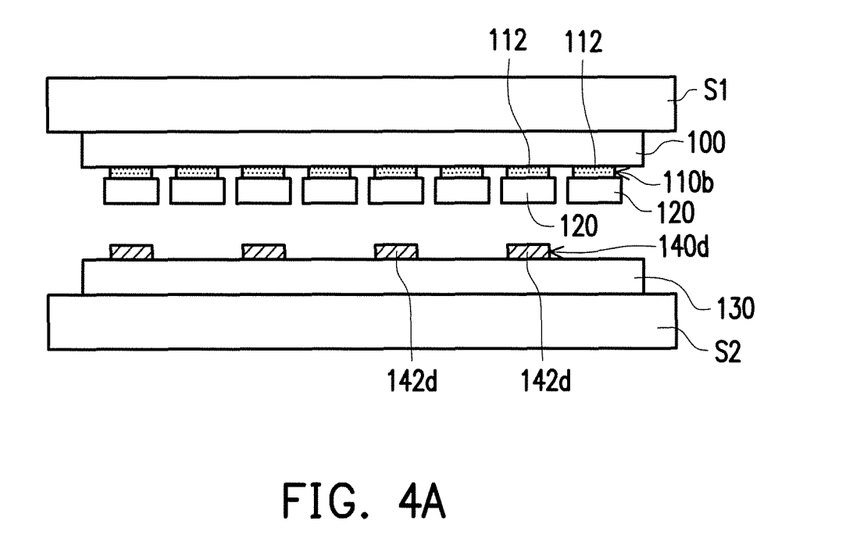
FIG. 4A to FIG. 4C are schematic cross-sectional views of a method of transferring micro devices in another embodiment of the invention.
Figure 4B:
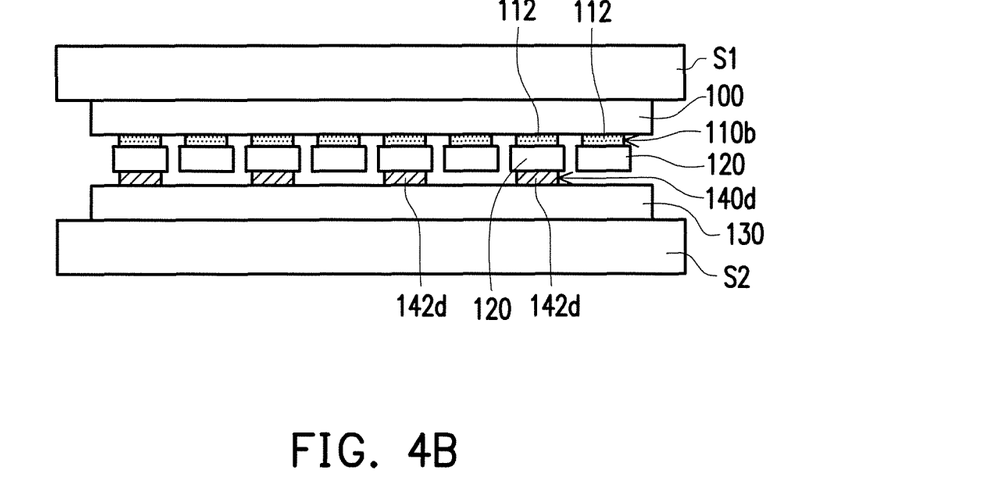
Figure 4C:
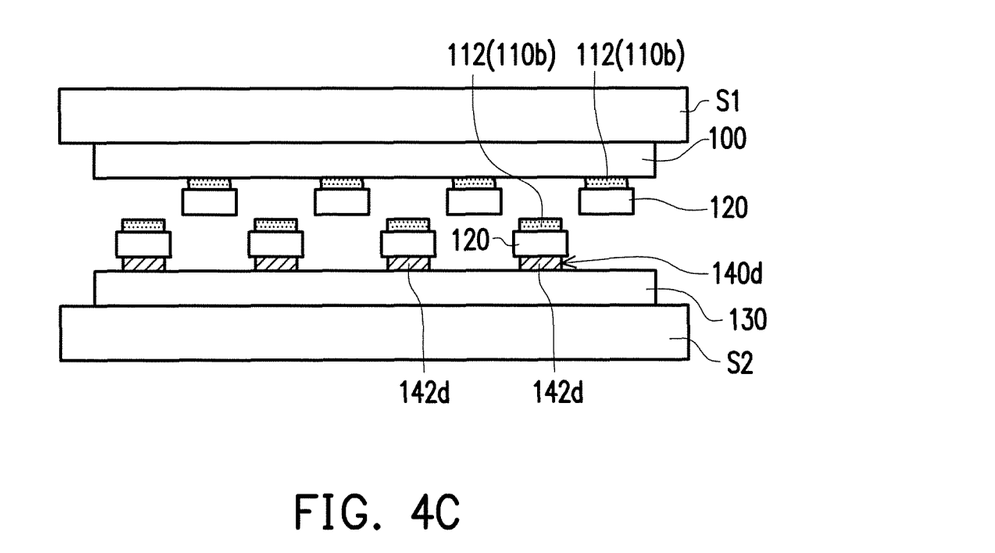

FIG. 4A to FIG. 4C are schematic cross-sectional views of a method of transferring micro devices in another embodiment of the invention. Please refer to FIG. 4A, FIG. 4B, FIG. 2A and FIG. 2B altogether. The transfer of micro devices of the present embodiment is similar to the transfer of micro devices in FIG. 2A and FIG. 2B. A difference between them lies in: in the step in which the receiving substrate 130 contacts the micro devices 120 on the carrier substrate 100, bonding parts 142d of a bonding layer 140d of the present embodiment are formed on the receiving substrate 130 and the bonding parts 142d only correspond to a portion of the micro devices 120. That is to say, the bonding parts 142d of the bonding layer 140d of the present embodiment are selectively formed on the receiving substrate 130. Therefore, when the receiving substrate 130 contacts the micro devices 120 on the carrier substrate 100, only a portion of the micro devices 120 are bonded onto the receiving substrate 130 through the bonding parts 142d of the bonding layer 140d.

Then, please refer to FIG. 4C. Similarly to the step in FIG. 2C, the temperatures of the carrier substrate 100 and the receiving substrate 130 are changed. Due to the temperature difference between the carrier substrate 100 and the receiving substrate 130, a portion of the micro devices 120 are released from the carrier substrate 100 onto the receiving substrate 130. As shown in FIG. 4C, at this moment, a portion of the micro devices 120 remain positioned on the carrier substrate 100 and are not yet transferred onto the receiving substrate 130. In other words, the method of transferring micro devices of the present embodiment may partly or selectively transfer the micro devices 120 on the carrier substrate 100 onto the receiving substrate 130.

Figure 5A:
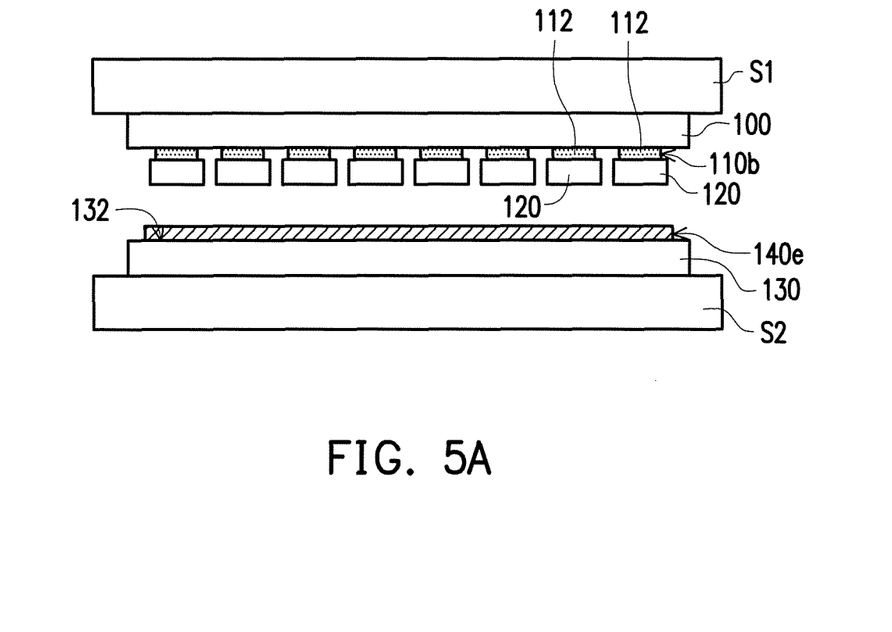
FIG. 5A to FIG. 5C are schematic cross-sectional views of a method of transferring micro devices in another embodiment of the invention.
Figure 5B:
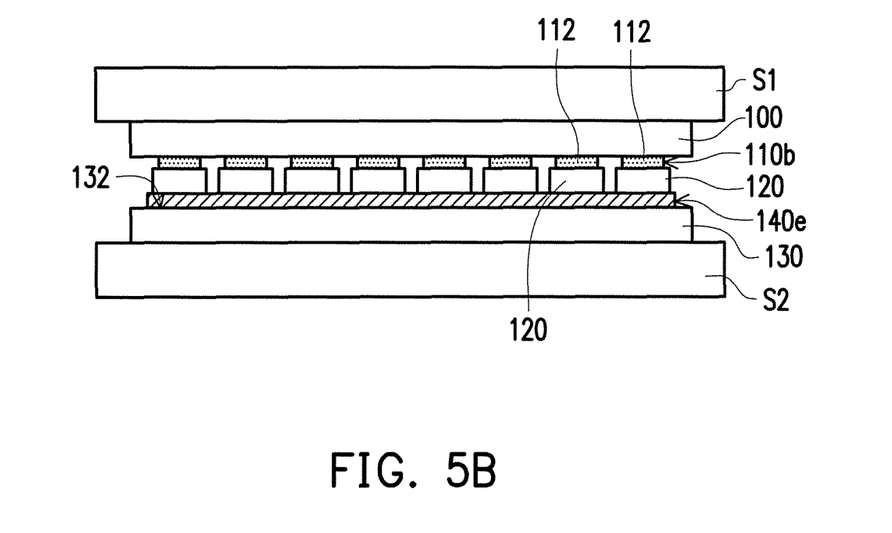
Figure 5C:
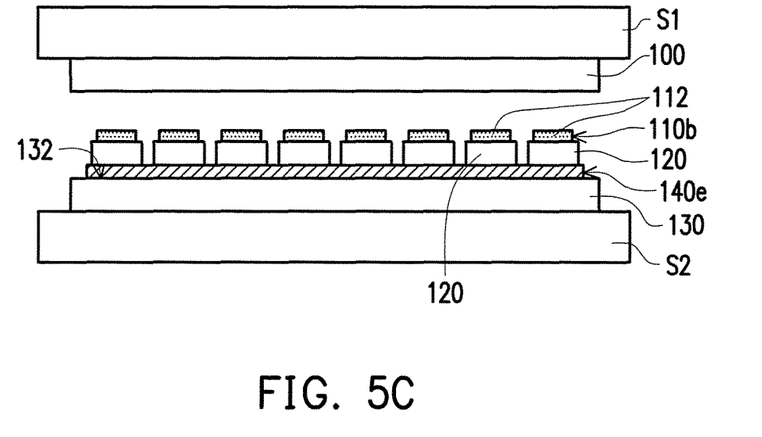

FIG. 5A to FIG. 5C are schematic cross-sectional views of a method of transferring micro devices in another embodiment of the invention. Please refer to FIG. 5A, FIG. 5B, FIG. 2A, and FIG. 2B altogether. The transfer of micro devices of the present embodiment is similar to the transfer of micro devices in FIG. 2A and FIG. 2B. A difference between them lies in: in the step in which the receiving substrate 130 contacts the micro devices 120 on the carrier substrate 100, a bonding layer 140e of the present embodiment is formed on the receiving substrate 130 and entirely covers an upper surface 132 of the receiving substrate 130. That is to say, the bonding layer 140e is an unpatterned structural layer. Therefore, when the receiving substrate 130 contacts the micro devices 120 on the carrier substrate 100, the micro devices 120 are all bonded onto the receiving substrate 130 through the bonding layer 140e.

Then, please refer to FIG. 5C. Similarly to the step in FIG. 2C, the temperatures of the carrier substrate 100 and the receiving substrate 130 are changed. Due to the temperature difference between the carrier substrate 100 and the receiving substrate 130, all of the micro devices 120 are released from the carrier substrate 100 onto the receiving substrate 130. In brief, the method of transferring micro devices of the present embodiment may entirely transfer the micro devices 120 on the carrier substrate 100 onto the receiving substrate 130.

In summary, in the method of transferring micro devices in the invention, the receiving substrate contacts the micro devices on the carrier substrate that are in a number ranging from 1000 to 2000000. Then, by changing the temperature of at least one of the carrier substrate and the receiving substrate, at least a portion of the micro devices on the carrier substrate are released onto the receiving substrate, thereby completing the transfer of the micro devices. Compared with the conventional method of transferring LEDs through the force at a distance such as electrostatic force or magnetic force, the method of transferring micro devices in the invention achieves bulk transfer of micro devices and has an advantage of high transferring efficiency.

It will be apparent to those skilled in the art that various modifications and variations can be made to the disclosed embodiments without departing from the scope or spirit of this invention. In view of the foregoing, it is intended that the invention covers modifications and variations provided that they fall within the scope of the following claims and their equivalents.

What is claimed is:

1. A method of transferring micro devices, comprising:
providing a carrier substrate, on which a buffer layer and a plurality of micro devices are disposed, the buffer layer being located between the carrier substrate and the micro devices, an upper surface of each of the micro devices is entirely in contact with the buffer layer, the micro devices being separated from one another and positioned on the carrier substrate through the buffer layer;
providing a bonding layer between the micro devices and a receiving substrate;
making a receiving substrate contact the micro devices on the carrier substrate;
after the micro devices contact the receiving substrate, reducing bonding force between at least a portion of the micro devices and the carrier substrate by melting the buffer layer through raising a temperature of the carrier substrate; and
liquefying the bonding layer by raising a temperature of the receiving substrate such that adhesive force between the at least a portion of the micro devices and the bonding layer is greater than bonding force between the at least a portion of the micro devices and the carrier substrate, so that the at least a portion of the micro devices are released from the carrier substrate and transferred onto the receiving substrate, wherein a number of the at least a portion of the micro devices is in a range from 1000 to 2000000.

2. The method of transferring micro devices as recited in claim 1, wherein the buffer layer covers a lower surface of the carrier substrate and the micro devices expose a portion of the buffer layer.

3. The method of transferring micro devices as recited in claim 1, wherein the buffer layer comprises a plurality of buffer parts corresponding to the micro devices, and the buffer parts are separated from one another and expose a portion of the carrier substrate.

4. The method of transferring micro devices as recited in claim 1, wherein making the receiving substrate contact the micro devices on the carrier substrate comprises:
providing a bonding layer between the micro devices and the receiving substrate, the micro devices contacting the receiving substrate through the bonding layer.

5. The method of transferring micro devices as recited in claim 4, wherein the bonding layer is formed on the micro devices or on the receiving substrate so as to entirely cover a plurality of lower surfaces of the micro devices or an upper surface of the receiving substrate.

6. The method of transferring micro devices as recited in claim 4, wherein the bonding layer comprises a plurality of bonding parts corresponding to the micro devices.

7. The method of transferring micro devices as recited in claim 6, wherein the bonding parts are formed on the micro devices, on the receiving substrate, or on both the micro devices and the receiving substrate.

8. The method of transferring micro devices as recited in claim 7, wherein the bonding parts of the bonding layer are selectively formed on the micro devices.

9. The method of transferring micro devices as recited in claim 6, wherein the buffer layer comprises a plurality of buffer parts corresponding to the micro devices.

10. The method of transferring micro devices as recited in claim 6, wherein areas of orthographic projections of the bonding parts on the receiving substrate completely overlap and are smaller than areas of orthographic projections of the corresponding micro devices on the receiving substrate.

11. The method of transferring micro devices as recited in claim 6, wherein each of the micro devices has two electrodes, and each of the bonding parts is formed into two parts separated from each other, and the two parts of the bonding parts correspond to the two electrodes of the micro device.

12. The method of transferring micro devices as recited in claim 4, wherein the temperature of the carrier substrate differs from the temperature of the receiving substrate after the temperatures of the carrier substrate and the receiving substrate are changed.

13. The method of transferring micro devices as recited in claim 12, wherein a material of the bonding layer is identical to a material of the buffer layer, a melting point temperature of the bonding layer is Tmr, the temperature of the carrier substrate is Tc, the temperature of the receiving substrate is Tr, and Tr<Tmr<Tc.

14. The method of transferring micro devices as recited in claim 12, wherein a material of the bonding layer differs from a material of the buffer layer, a melting point temperature of the bonding layer is Tmr, a melting point temperature of the buffer layer is Tmc, the temperature of the carrier substrate is Tc, the temperature of the receiving substrate is Tr, and Tc>Tmc and Tr<Tmr.

15. The method of transferring micro devices as recited in claim 12, wherein the buffer layer and the bonding layer are in different states after the temperatures of the carrier substrate and the receiving substrate are changed.

16. The method of transferring micro devices as recited in claim 1, wherein the temperature of the carrier substrate is raised to a range from 50 degree Celsius to 200 degree Celsius.

17. The method of transferring micro devices as recited in claim 1, wherein a maximum width of each of the micro devices is in a range from 3 μm to 100 μm.

18. The method of transferring micro devices as recited in claim 1, wherein each of the micro devices is an inorganic light emitting diode.

19. The method of transferring micro devices as recited in claim 1, wherein the carrier substrate is composed of an inorganic material, while the buffer layer is composed of an organic material, and hardness of the carrier substrate is greater than hardness of the buffer layer.

20. The method of transferring micro devices as recited in claim 19, wherein a Young's modulus of the buffer layer is smaller than 10 GPa, while a Young's modulus of the carrier substrate is greater than 20 GPa.

21. The method of transferring micro devices as recited in claim 19, wherein hardness of the micro devices is greater than the hardness of the buffer layer.

22. The method of transferring micro devices as recited in claim 21, wherein a Young's modulus of the buffer layer is smaller than 10 GPa, while Young's modulus of the micro devices are greater than 20 GPa.

23. The method of transferring micro devices as recited in claim 1, wherein surface roughness of the carrier substrate is smaller than 2.5 μm.

24. The method of transferring micro devices as recited in claim 1, wherein the carrier substrate is disposed on a first supporting board and the receiving substrate is disposed on a second supporting board.

25. The method of transferring micro devices as recited in claim 24, wherein raising the temperature of the carrier substrate comprises:
raising the temperature of the carrier substrate by heating through the first supporting board or by heating through the second supporting board via a heat conduction mechanism.

26. The method of transferring micro devices as recited in claim 24, wherein raising the temperature of the receiving substrate comprises:
raising the temperature of the receiving substrate by heating the receiving substrate through the second supporting board.

27. The method of transferring micro devices as recited in claim 1, wherein the temperatures of the carrier substrate and the receiving substrate are changed so at least a portion of the buffer layer is released from the carrier substrate and transferred onto the receiving substrate.

28. The method of transferring micro devices as recited in claim 1, wherein at least a portion of the buffer layer is transferred to the receiving substrate with the at least a portion of the micro devices, and the at least a portion of the buffer layer is attached to the at least a portion of the micro devices.

29. A method of transferring micro devices, comprising:
providing a carrier substrate, on which a buffer layer and a plurality of micro devices are disposed, the buffer layer being located between the carrier substrate and the micro devices, the buffer layer comprises a plurality of buffer parts corresponding to the micro devices, the buffer parts are separated from one another and expose a portion of the carrier substrate, the micro devices being separated from one another and positioned on the carrier substrate through the buffer layer;

providing a bonding layer between the micro devices and a receiving substrate;

making a receiving substrate contact the micro devices on the carrier substrate;

after the micro devices contact the receiving substrate, reducing bonding force between at least a portion of the micro devices and the carrier substrate by melting the buffer layer through raising a temperature of the carrier substrate; and liquefying the bonding layer by raising a temperature of the receiving substrate such that adhesive force between the at least a portion of the micro devices and the bonding layer is greater than the bonding force between the at least a portion of the micro devices and the carrier substrate, so that the at least a portion of the micro devices are released from the carrier substrate and transferred onto the receiving substrate.

30. The method of transferring micro devices as recited in claim 29, wherein the bonding layer is formed on the receiving substrate, or on both the micro devices and the receiving substrate.

* * * * *